United States Patent
Ishitsuka et al.

(10) Patent No.: US 6,403,446 B1
(45) Date of Patent: Jun. 11, 2002

(54) METHOD FOR MANUFACTURING SEMICONDUCTOR DEVICE

(75) Inventors: Norio Ishitsuka, Ibaraki-ken; Hideo Miura, Koshigaya; Shuji Ikeda, Koganei; Yasuko Yoshida, Sayama; Norio Suzuki, Mito; Masayuki Kojima, Kokubinji; Kota Funayama, Oume, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/536,447

(22) Filed: Mar. 28, 2000

Related U.S. Application Data

(63) Continuation of application No. 09/363,184, filed on Jul. 29, 1999, now Pat. No. 6,090,684.

(30) Foreign Application Priority Data

Jul. 31, 1998 (JP) .......................................... 10-216831

(51) Int. Cl.⁷ .............................................. H01L 21/76
(52) U.S. Cl. ........................ 438/424; 438/425; 438/435; 148/DIG. 50
(58) Field of Search ................................. 438/424, 425, 438/435, 437; 148/DIG. 50

(56) References Cited

U.S. PATENT DOCUMENTS

| | | |
|---|---|---|
| 4,580,330 A | 4/1986 | Pollack et al. |
| 5,258,332 A | 11/1993 | Horioka et al. |
| 5,578,518 A | 11/1996 | Koike et al. |
| 5,719,085 A | 2/1998 | Moon et al. |
| 5,863,827 A | 1/1999 | Joyner |
| 5,956,598 A | 9/1999 | Huang et al. |
| 6,090,684 A | * 7/2000 | Ishitsuka et al. ............ 438/424 |

FOREIGN PATENT DOCUMENTS

| | | |
|---|---|---|
| JP | 2-260660 | 10/1990 |
| JP | 7-74164 | 3/1995 |

OTHER PUBLICATIONS

Technical Digest of IEDM '94, pp. 671–674.

* cited by examiner

*Primary Examiner*—Trung Dang
(74) *Attorney, Agent, or Firm*—Mattingly, Stanger & Malur, P.C.

(57) ABSTRACT

Manufacturing a semiconductor device avoiding an increase of transistor leak current or reduction of the withstanding voltage characteristics is by at least one of: The pad oxide film is removed along the substrate surface from the upper edge of the groove over a distance ranging from 5 to 40 nm: The exposed surface of the semiconductor substrate undergoes removal by isotropic etching within 20 nm; and oxidizing a groove portion formed in a semiconductor substrate in an oxidation environment with a gas ratio of hydrogen ($H_2$) to oxygen ($O_2$) being less than or equal to 0.5, an increase of the curvature radius beyond 3nm is achieved without associating the risk of creation of any level difference on the substrate surface at or near the upper groove edge portions in a groove separation structure. This eliminates either an increase of transistor leak current or reduction of the withstanding voltage characteristics thereof otherwise occurring due to local electric field concentration near or around the terminate ends of a gate electrode film which in turn leads to an ability to improve electrical reliability of transistors used.

8 Claims, 5 Drawing Sheets

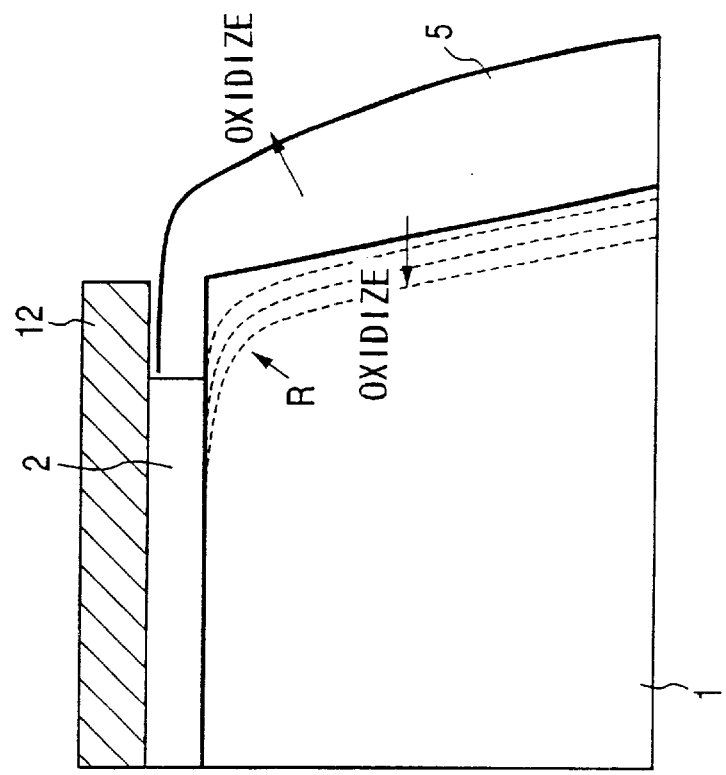
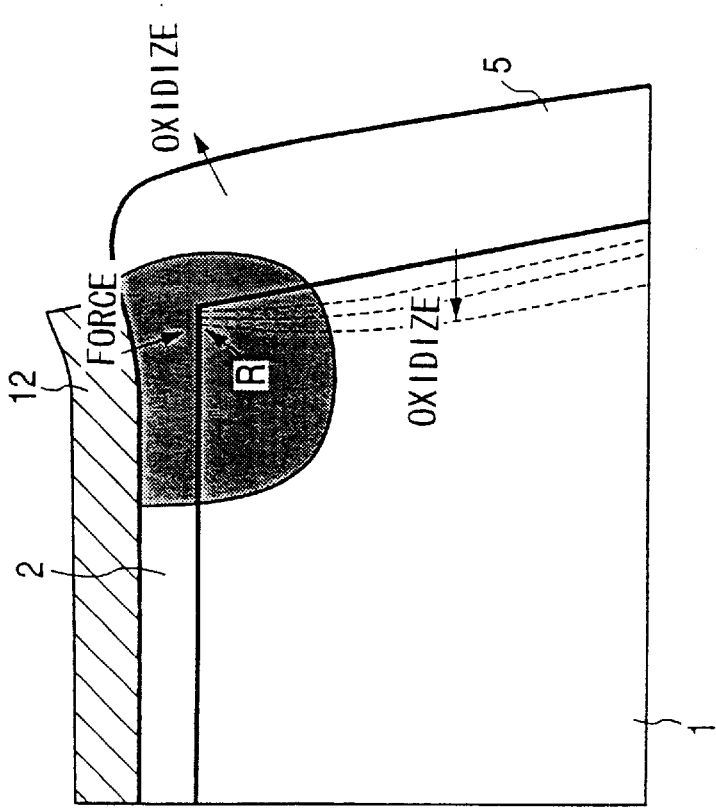

METHOD FOR MANUFACTURING SEMICONDUCTOR DEVICE

This is a continuation application of U.S. Ser. No. 09/363,184, filed Jul. 29, 1999 now U.S. Pat. No. 6,090,684.

BACKGROUND OF THE INVENTION

A SGI(Shallow Groove Isolation) structure is a structure which electrically insulates adjoining transistor on a semiconductor substrate. The SGI structure is formed following processes. Forming a groove at a silicon substrate forming a pad oxide film on the silicon substrate forming an oxidation inhibition film on the pad oxide film and afterwards. thermally oxidize the surface of the groove to form an element isolation thermal oxide film on the surface of the groove and burying in the groove an insulating film. Further formed thereon are several films including a gate oxide film a gate electrode film a dielectric film, a lead an interlayer dielectric film and so on to thereby obtain a semiconductor device.

This SGI structure becomes the suitable structure in the device after the 0.25 μm process because dimensional accuracy of the SGI structure is higher than conventional LOCOS(Local Oxidation of Si) structure of which has been used more than 0.25 μm process. However. when thermally oxidize the surface of the groove to form the element isolation thermal oxide film, there is a case that the groove upper edge becomes acute angle. Such acute angled part remain of the groove upper edge, as A. Bryant et al disclosed in "Technical Digest of IEDM'94.pp.671–674" an electric field concentration arises at the acute angled part under circuit operation. and. there is a case that decline in characteristics of transistors and voltage characteristics of capacitors.

As a solution of these problems JP-A-2-260660 disclose that before thermally oxidize the surface of the groove to form an element isolation thermal oxide film, remove the pad oxide film about 0.1 μm from sidewall in the groove upper edge. And after that, by oxidizing at the temperature about 1000° C. with a steam. to roundly form the the groove upper edge.

SUMMARY OF THE INVENTION

Above method (JP-A-2-260660) could roundly form the groove upper edge but characteristics of transistors could not be improved.

The inventor analyze the reason why the characteristics of transistors could not be improved by above method (JP-A-2-260660) and the following was discovered as a result of analyzingsis. Above method (JP-A-2-260660) is useful to roundly form the groove upper edge but there is a case that substrate level difference arose in the silicon substrate upper surface because in the exposed region by pad oxide film removal. the oxidation progresses in comparison with not removal region.

The gate oxide film thickness becomes unequal when the gate oxide film is formed in such level difference so electrical weak spots is formed and stress concentration occur. Therefore, characteristics of transistors formed on the level difference decline.

An object of the present invention to provide a novel and improved method for manufacturing a semiconductor device capable of avoiding the problems faced with the prior art.

In order to achieve the purpose inventor did experiments and analyses and then the inventor found following contents.

1) Removing the pad oxide film along the substrate surface from the upper edge of the groove over a distance ranging from 5 to 40 nm to prevent creation of level difference at or near the upper groove edges while simultaneously increasing the radius curvature thereat to go beyond a specified value.

As the removal of the pad oxide film becomes greater in value from 0 nm the radius curvature at the upper substrate edges increases accordingly. The radius curvature becomes about 15 nm when the removal amount is 5 nm. When the removal is set at 20 nm the radius curvature increase about 25 nm. Note however that if the removal amount is excessively increased not less than 40 nm the resulting radius curvature behaves to decrease rather than increase. This would result in occurrence of the level difference at or near the upper groove edges.

Accordingly, forcing the pad oxide film to remove from the upper edges of the groove within a limited range of from 5 to 40 nm may enable elimination of generation of level differences at or near such groove edges while at the same time enabling the radius curvature at the groove edges to increase beyond a predetermined value.

2) Removing the exposed surface of the semiconductor substrate by isotropic etching methods within a range of more than 0 nm and not more than 20 nm. And so above method may eliminate creation of the level difference.

The curvature radius in the groove upper edge is approximately at 15 nm when the silicon etching quantity is 0 nm, and is about 30 nm when the etching amount is between 10 and 20 nm. In a region with the etching amount greater than 20 nm the level difference can reside at the "upper" groove edge portions. This makes the radius curvature tend to decrease below 20 nm.

Upon occurrence of the level difference at or near the upper groove edge the fabrication of a gate oxide film fails to exhibit uniformity resulting in production of electrical weak spots therein. In this respect, setting the upper limit of the silicon substrate etching amount at such specific value 20 nm makes it possible to prevent creation of any level difference on the substrate.

3) Oxidizing a groove portion formed in said semiconductor substrate in an oxidation environment with a gas ratio of hydrogen ($H_2$) to oxygen ($O_2$) being less than or equal to 0.5. And so, above method permits the intended oxidation to progress under lower stresses at the upper groove edges of the semiconductor substrate thereby enabling achievement of rounding of the upper groove edges of silicon substrate.

Oxidation causes deformation (stress) near or around the interface between silicon and the silicon oxide film. On the other hand, the silicon oxide film exhibits significant viscosity behavior at high temperatures (900° C. or above). Thus any stresses generated will become less intense with time.

Consequently, assuming that the oxide film thickness stays constant the residual stresses generated becomes increased. This can be said because although the generated deformation (stress) might be kept constant in value, a time taken for the generated stress to relax is shortened with an increase in oxidation rate (namely. increase in $H_2/O_2$ gas ratio).

In cases where the oxidation rate is low (i.e. the $H_2/O_2$ gas ratio r is small). the silicon oxide films viscosity effect becomes operative accelerating relative stress relaxation while the oxide film thickness is kept unchanged. The stronger the oxidation induction stresses the greater the suppression of oxidation at part near or around it.

Accordingly, in view of the fact that the upper groove edges of silicon substrate or its nearby regions are the location whereat stresses attempt to locally concentrate during growth of an oxide film bidirectionally from both its upper surface and the lateral surfaces thereof the higher the residual stresses the more effective the suppression of oxidation near this location. This results in the edges becoming sharpened more and more at their tip ends.

In light of the foregoing, reducing the $H_2/O_2$ gas ratio r permits the intended oxidation to progress under lower stresses at the upper groove edges of the semiconductor substrate 1 thereby enabling achievement of rounding of the upper groove edges of silicon substrate.

Suppose that an Ar gas or $N_2$ gas is introduced into a furnace with the $H_2/O_2$ gas ratio r kept constantly at 1.8 to thereby effectuate dilution approximately 0.6 times. The resulting oxidation rate is nearly equal to the value 0.5 of the $H_2/O_2$ gas ratio r. This in turn to achieve the intended radius curvature of 3 nm even under the condition that the $H_2/O_2$ gas ratio r is 1.8.

BRIEF DESCRIPTION OF THE DRAWING

FIGS. 3(a)–3(b) are diagrams for explanation of an operation and effect of the first embodiment of the invention.

DESCRIPTION OF THE PREFERRED EMBODIMENTS

Figure 1A:
FIGS. 1(a)–1(j) are diagrams showing, in schematical cross-section some of major process steps in the manufacture of a semiconductor device with the SGI structure in accordance with a first embodiment of the present invention.
Figure 1B:
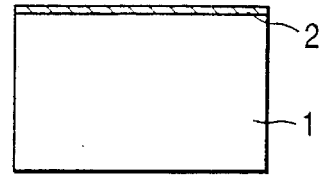
Figure 1C:
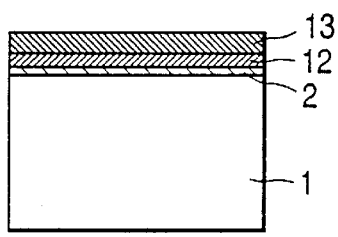
Figure 1D:
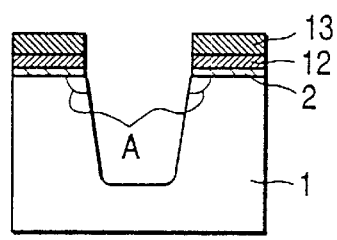

Preferred embodiments of the present invention will be explained with reference to the accompanying drawings.

An explanation will first be given of a method for manufacturing a semiconductor device having a groove isolation structure in accordance with a first embodiment of the instant invention in conjunction with FIGS. 1(a) to 1(j).

FIGS. 1(a) to 1(j) illustrate in cross-section, some of the major steps in the manufacture of the semiconductor device in accordance with the first embodiment.

Step 1: Thermally oxidize the surface of a silicon substrate 1 to form a pad oxide film 2 to a thickness of approximately 10 nm (FIGS. 1(a). 1(b)). Though it is desirable that the thickness of the pad oxide film 2 is over 5 nm, a problem occurs when the thickness is too thick. Because, finally the pad oxide film is removed in following step 10 and if the thickness of the pad oxide film 2 is too thick long time is required to remove the pad oxide film 2. It gives the adverse effect to other films.

Step 2: Deposit a silicon nitride film 12 on the pad oxide film 2 to a thickness of about 200 nm. This silicon nitride film 12 is used as an oxidation inhibition film during fabrication of an element isolation oxide film 5.

Step 3: Form a photoresist 13 on the silicon nitride film 12 (FIG. 1(c)).

Step 4: After having removed portions of the photoresist 13 at desired positions by using known exposure techniques the silicon nitride film 12 and pad oxide film 2 are patterned: then form a groove in the substrate surface with the patterned silicon nitride film 12 (FIG. 1(d)).

The groove has inner sidewalls each of which is slanted relative to a direction along the thickness of the substrate 1 so that the opposite upper groove edge portions "A" are at an angle of from 90 to 110 degrees with respect to the substrate surface.

Step 5: After having removed all of the photoresist 13 the pad oxide film 2 is partly etched so that its "rim" portions residing at the groove sidewalls are selectively removed away the film 2 retrogress along the substrate surface within a range of 5 to 40 nm (FIG. 1(e)).

Step 6: Remove an exposed portion of the silicon substrate 1 by isotropic etching techniques (wet or dry etching methods), which portion is greater than zero and less than or equal to 20 nm in depth as measured from the top surface of substrate 1 (FIG. 1(f))

Step 7: Thereafter put the resulting silicon substrate 1 in a dry oxidation atmosphere. Then thermally oxidize the surface of substrate 1 at temperatures of 900 to 1.100° C. for example, with respect to its surface portion of about 30 nm thick thereby forming a thermal oxide film 5 for element isolation that covers the substrate surface including the sidewalls and bottom of the groove (FIG. 1(g)).

Step 8: Deposit a insulation film such as a silicon oxide film 6 or the like by chemical vapor deposition (CVD) or sputtering techniques to embed or bury the groove (FIG. 1(h)).

The film 6 will be referred to as buried insulation film hereinafter. Optionally the silicon substrate 1 may be oxidized in an anneal or oxidation atmosphere at 1.100° C. or therearound. This substrate oxidation is for improving denseness of such buried insulation film 6 thus deposited, in view of the fact that silicon oxide films fabricated by CVD or sputter methods are generally coarse in density in terms of the film quality.

Step 9: Then etch back the buried insulation film 6 by chemical/mechanical polishing (CMP) methods or dry etching methods. When this is done, the silicon nitride film 12 which was used as the oxidation inhibition film now behaves as an etching stopper that functions to prevent the silicon substrate 1 underlying the silicon nitride film 12 from being etched unintentionally (FIG. 1(i)).

Step 10: Then, remove the silicon nitride film 12 and pad oxide film 2 thus completing fabrication of the SGI structure (FIG. 1(j)).

Thereafter, the semiconductor device is completed through several process steps required for fabrication of transistor structures, typically including formation of a gate oxide film and gate electrodes implantation of impurities required, formation of on-chip leads and buried insulation films plus multilayer lead structures deposition of a surface protection film, and the like.

An explanation will next be given of an operation and effect of the first embodiment with reference to FIGS. 2 and 3.

Figure 1E:
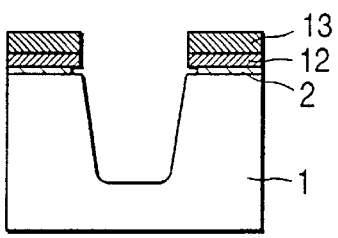
Figure 1F:
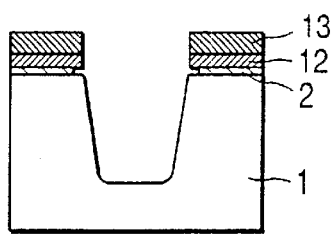
Figure 1G:
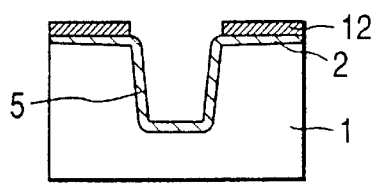
Figure 1H:
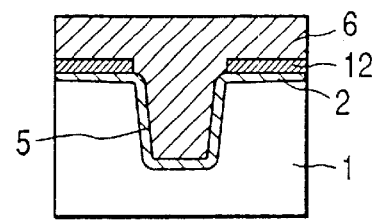
Figure 1I:
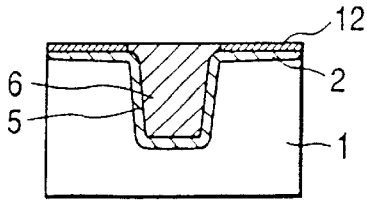
Figure 1J:
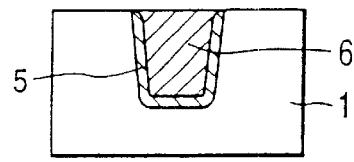

Principally, the important point of first embodiment that is a selected surface portion of the silicon substrate 1 is removed away by isotropic etching techniques within a range of from 0 nm to 20 nm (FIG. 1(f)) at the manufacturing step 6 stated above, and that the removal amount of the pad oxide film 2 at the step 5 (FIG. 1(e)) is carefully controlled at a limited value.

Figure 2:
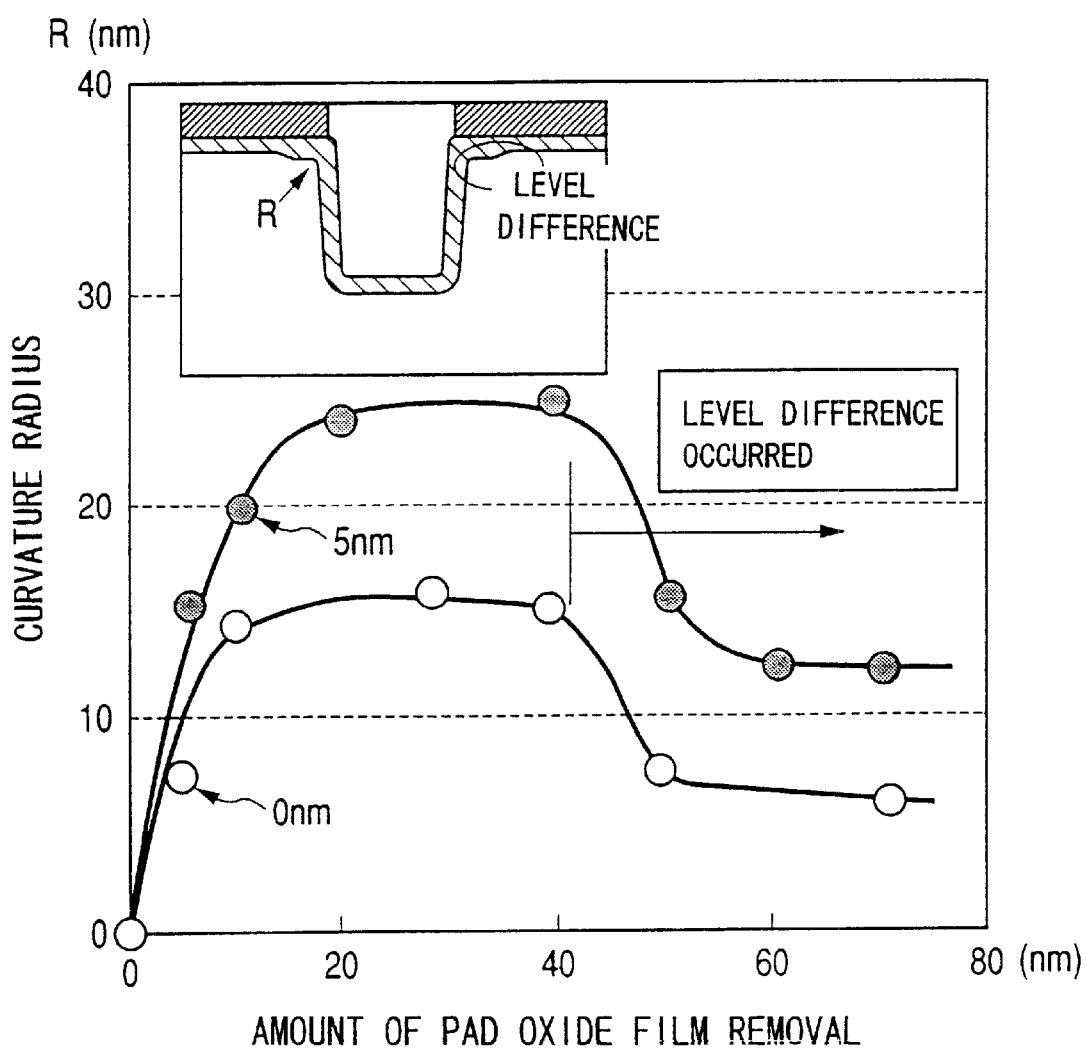
FIG. 2 is a diagram for explanation of an operation and effect of the first embodiment of this invention.

FIG. 2 is a graph that demonstrates a result of analysis on how the curvature radius varies at certain portions of the silicon substrate 1 near the upper edges of the groove while setting the oxidation amount at 30 nm and the etching amount of silicon substrate 1 at 5 nm with the pad oxide film 2 changed in removal amount. The transverse axis of the FIG. 2 graph represents the degree of removal of pad oxide film 2 whereas the vertical axis indicates the curvature radius of the silicon substrate's 1 upper groove edge portions. And there is also indicated for comparison purposes a result of the prior art method with the silicon etching eliminated in FIG. 2.

As apparent from FIG. 2 with the device structure manufactured by the method of the first embodiment, the substrate's 1 upper groove edges become greater in radius curvature with an increase in along-the-surface removal distance of the pad oxide film 2 from 0 nm. At the removal of 5 nm the radius curvature measures approximately 15 nm. When the former is at 20 nm the latter increases up to about 25 nm. Note however that in the event the removal distance increases at 40 nm or greater the radius curvature behaves to decrease rather than increase: it drops down at about 12 nm when the removal is 60 nm.

Further within a range the removal is greater than or equal to 40 nm it has been observed that the level difference occurred on the substrate surface at or near the upper edges of the groove, as depicted in FIG. 2.

On the contrary, in the case of using prior art methods without effectuation of such silicon etching process, the resultant radius curvature is smaller by about 10 nm than that of the first embodiment of the invention irrespective of setup of the removal amount of the pad oxide film 2. When the removal amount is above 40 nm the level difference did appear resulting in a decrease in radius curvature.

Here, let's discuss about the dependency of the radius curvature of FIG. 2 upon the removal amount of pad oxide film 2. During oxidation inside the groove, an oxide film will grow between the silicon nitride film 12 and the silicon substrate 1 in a way such that it exhibits nearly doubled cubical expansion (FIG. 3(a)).

In case the pad oxide film 2 is 0 nm in removal amount, that is when the removal processing of pad oxide film 2 is eliminated this cubical expansion causes the edge portion of the silicon nitride film 12 to partly rise.

This partly rise of the silicon nitride film 12 leads to generation of a counterforce which results in production of compressive stresses between the oxide film underlying the warped silicon nitride film 12 (also including part of the pad oxide film 2) and the silicon substrate 1 (FIG. 3(a)).

Upon generation of such compressive stresses inside of the oxide film, diffusion of oxidizing species is suppressed or restricted the oxidation rate much decrease at the upper groove edges.

On the other hand on the substrate sidewalls inside the groove the intended oxidation relatively freely progresses on such sidewalls without any limitations due to the fact that no constraints are present in the oxide film growth direction (in the direction normal to sidewalls) and also any obstructive parameters are absent of the cubical expansion of an oxide film under growth. Thus, near or around the upper groove edges of silicon substrate 1, the substrate gets acutely sharpened more and more in cross-sectional shape with progress of oxidation as indicated by broken lines in FIG. 3(a).

However removal of the pad oxide film 2 results in exposure of part of the top surface of silicon substrate 1 around the upper groove edges (cf FIG. 3(b)). At such exposed portion, the oxide film grown at the beginning of the oxidation process is hardly contacted with its overlying silicon nitride film 12. Accordingly any compressive stresses will no longer take place which otherwise occur due to warp deformation of the silicon nitride film 12 as discussed previously in conjunction with FIG. 3(a). This ensures that the intended oxidation progresses smoothly without association of any restriction or retardation.

Such free oxidation progression results in the upper groove edges becoming rounded the radius curvature increase accordingly. In addition when the pad oxide film 2 is remove along the substrate surface, a silicon-exposed region and a silicon-covered region appear near the upper groove edges of the pad oxide film 2 thus removed.

Although in the exposed region the oxidation progresses at increased rates due to rapid diffusion of oxygen therein, the oxidation gets decelerated in the non-exposed region resulting in creation of the level difference at the edges of the pad oxide film 2.

Also note that as the upper groove edges of silicon substrate 1 are in double-face contact with oxygen, the oxidation progresses at high rates. Where the removal amount of the pad oxide film 2 is less than 40 nm the edges of pad oxide film 2 are in close proximity to the upper groove edges of silicon substrate 1. Thus the above influences overlap each other resulting in creation of no level differences. However when the removal amount of pad oxide film 2 increases beyond 40 nm, the level difference can occur because the end portions of the film 2 go far from the silicon groove upper edges. Thus, the radius curvature gets smaller accordingly.

Furthermore as any acute or sharp edge portions in the initial silicon cross-section have been isotropically etched away the resulting radius curvature was greater than obtained by prior art methods.

Next the silicon substrate etching amount dependency will be explained in detail below.

Figure 4:
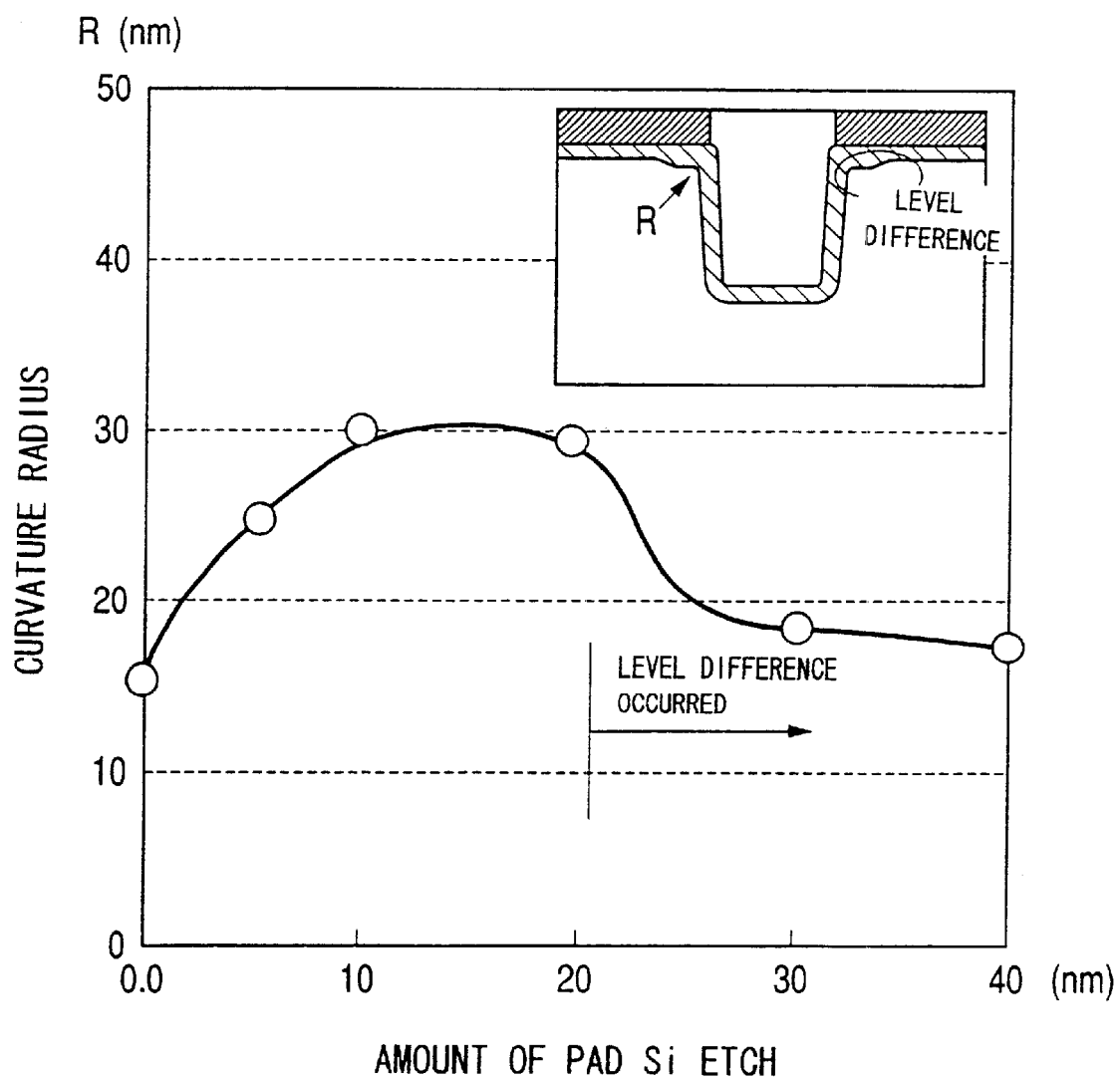
FIG. 4 is a diagram for explanation of an operation and effect of the first embodiment of the invention.

See FIG. 4. This graph shows the silicon etching amount dependency of the radius curvature at upper groove edges of the silicon substrate 1 in case the pad oxide film 2 is set at 20 nm in removal amount. It is apparent from viewing FIG. 4 that when the silicon etching amount is 0 nm, the radius curvature is about 15 nm.

When the etching amount is between 10 and 20 nm, the curvature is approximately 30 nm. The level difference occurs when the etching amount is 20 nm or greater while the radius curvature exhibit tendency of decreasing down at 20 nm or less.

As previously stated, if level difference arose in the silicon substrate upper surface, the gate oxide film thickness becomes unequal so electrical weak spots is formed and stress concentration occur.

Therefore, the etching amount of the silicon substrate 1 should stay equal to or less than 20 nm which is the upper limit value.

It is noted that if the oxidation is further continued at the process step 7 discussed previously, then the oxide film grown at the exposed portion can come into contact with the silicon nitride film 12 resulting in severe generation of compressive stresses in the way stated supra. This in turn causes the radius curvature at the upper groove edges to decrease again.

In the first embodiment of the invention the removal amount of the pad oxide film 2 is limited range of from 5 to 40 nm. Thus it sufficiently enlarge the radius curvature beyond 3 nm without associating the risk of creation of the level difference near or around the upper groove edges of the substrate having the SGI structure. This prevent unwanted increase of leak currents in transistors otherwise occurring due to local concentration of an electric field at or near the edge of an associative gate electrode film while enabling elimination of reduction of the withstanding-voltage characteristics thereof such as a rated DC voltage. Thus it improve the electrical reliability of the transistors involved.

It should be noted that all of the photoresist removing process in the step 5 is inserted between the groove forming process in the step 4 and the pad oxide film removing process in the step 5, the photoresist removing process may alternatively between the pad oxide film 2 patterning process in the step 4 and the groove forming process in the step 4.

Further in order to control the removal amount of the pad oxide film the pad oxide film removing process in the step 5 can be added to the process flow between the isotropic etching process in the step 6 and the thermally oxidizing process in the step 7. In such case, the pad oxide film removing process will be done two times and it is desirable that the finally obtained removal amount be within the range of from 5 to 40 nm.

An explanation will next be given of a manufacturing method of a semiconductor device having the groove separation structure in accordance with a second embodiment of the invention.

The manufacturing method of the second embodiment is same to the first embodiment method except the step 7. Therefore only process step 7 will be explained in detail.

Step 7: Thermally oxidize a surface portion of the groove portion formed in the silicon substrate 1 in a $H_2/O_2$ mixed gas oxidation atmosphere (in a range of preferably $0 \leq r \leq 0.5$ where "r" is the gas flow rate) which portion is about 30 nm thick.

An explanation will next be given of an operation and effect of the second embodiment with reference to FIG. 5.

Permissibly the gas ratio r of $H_2$ and $O_2$ in the oxidizing atmosphere varies within the range of $0 \leq r \leq 2$. If the gas ratio r reaches the value "2" then the reaction explosively progresses. It will thus be recommendable for safety purposes that the ratio be designed less than or equal to 0.5 which is the upper limit value.

Generally speaking, while the gas ratio r falls within the limited range above, the greater this ratio, the faster the oxidization rate: the less the former, the slower the latter. This is under the assumption that the oxidation temperature is kept constant. In this respect analysis was done to clarify how this oxidation rate affects the resultant sectional shape of the upper groove edges of the semiconductor substrate 1. A result of such analysis is shown in FIG. 5. Here, the removal amount of the pad oxide film 2 was set at 5 nm. In FIG. 5 the transverse axis represents the $H_2/O_2$ gas ratio whereas the vertical axis indicates the radius curvature of semiconductor substrate 1 at its upper groove edge portions.

Figure 5:
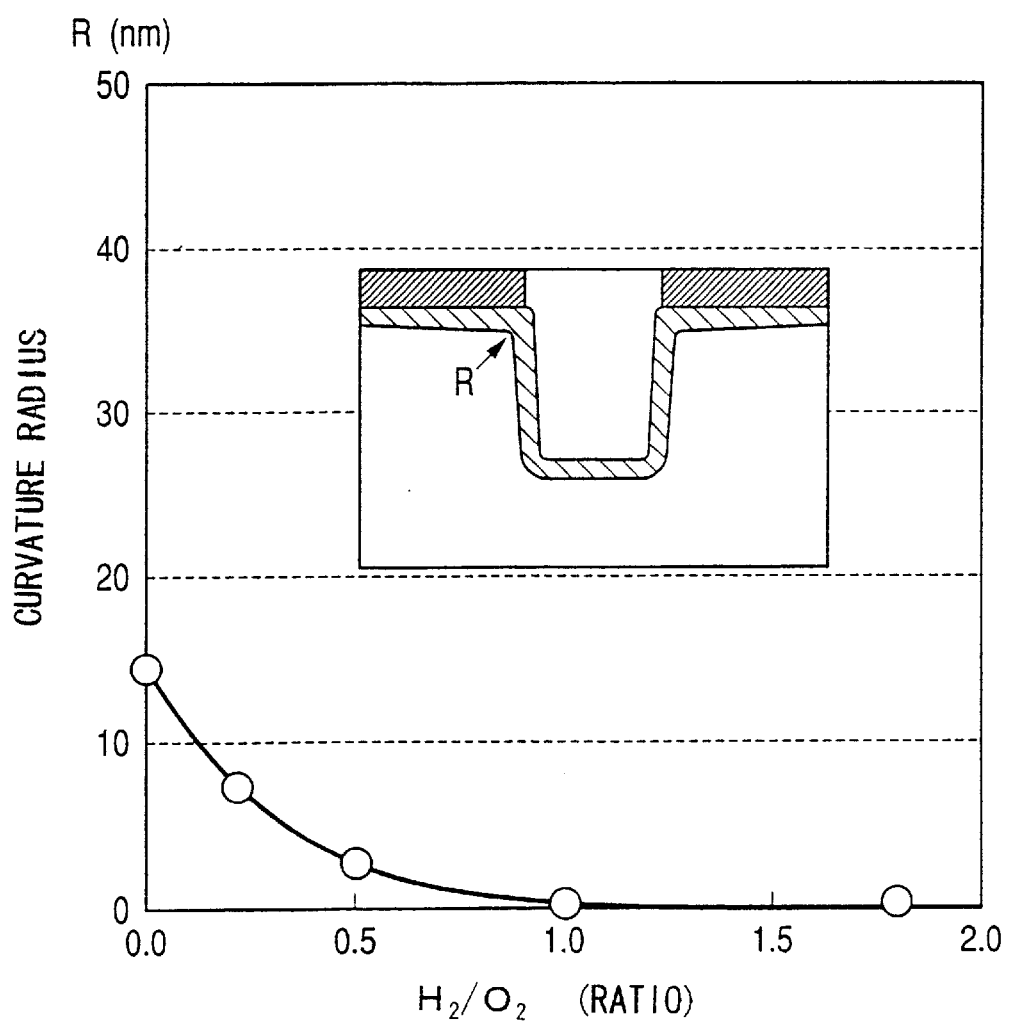
FIG. 5 is a diagram for explanation of an operation and effect of the second embodiment of the invention.

As apparent from the FIG. 5 graph the resulting radius curvature rapidly decreases with an increase in hydrogen ($H_2$) gas flow rate in the oxidation atmosphere. When the gas ratio r arrives at 0.5 the radius curvature drops down at about 3 nm. Further increasing the gas ratio r results in a decrease in radius curvature although such decrease is little by little.

The phenomenon above may be explained as follows.

As previously stated, oxidation causes deformation (stress) near or around the interface between silicon and the silicon oxide film. On the other hand the silicon oxide film exhibits significant viscosity behavior at high temperatures (900° C. or above). Thus any stresses generated will become less intense with time.

Consequently, assuming that the oxide film thickness stays constant, the residual stresses generated becomes increased. This can be said because although the generated deformation (stress) might be kept constant in value a time taken for the generated stress to relax is shortened with an increase in oxidation rate (namely increase in $H_2/O_2$ gas ratio).

In cases where the oxidation rate is low (i.e. the $H_2/O_2$ gas ratio r is small), the silicon oxide film's viscosity effect becomes operative accelerating relative stress relaxation while the oxide film thickness is kept unchanged. The stronger the oxidation induction stresses the greater the suppression of oxidation at part near or around it. Accordingly, in view of the fact that the upper groove edges of silicon substrate 1 or its nearby regions are the location whereat stresses attempt to locally concentrate during growth of an oxide film(s) bidirectionally from both its upper surface and the lateral surfaces thereof, the higher the residual stresses the more effective the suppression of oxidation near this location. This results in the edges becoming sharpened more and more at their tip ends.

In light of the foregoing, reducing the $H_2/O_2$ gas ratio r permits the intended oxidation to progress under lower stresses at the upper groove edges of the semiconductor substrate 1 thereby enabling achievement of rounding of the upper groove edges of silicon substrate 1.

Suppose that an Ar gas and/or $N_2$ gas is/are introduced into a furnace with the $H_2/O_2$ gas ratio r kept constantly at 1.8 to thereby effectuate dilution approximately 0.6 times. The resulting oxidation rate is nearly equal to the value 0.5 of the $H_2/O_2$ gas ratio r. This in turn makes it achieve the intended radius curvature of 3 nm even under the condition that the $H_2/O_2$ gas ratio r is 1.8.

For the reason above, in accordance with the second embodiment of the invention, it sufficiently increase the radius curvature at or near the substrate-side upper groove edges in the groove separation structure so that its value goes beyond 3 nm. In addition, with this embodiment, the removal amount of the pad oxide film is set falling within the limited range of from 5 to 40 nm as indicated in the first embodiment. This prevent creation of unwanted level difference at or near the upper groove edges of the substrate used. This may in turn eliminate undesired increase of transistor leak current otherwise occurring due to local electric-field concentration near or around the gate electrode film ends or alternatively prevent reduction of the withstanding voltage properties thereof, which finally leads to an advantage of improvability of electrical reliability of such transistors concerned.

An explanation will next be given of a manufacturing method of a semiconductor device having the groove separation structure in accordance with a third embodiment of the invention.

The manufacturing method of the third embodiment is same to the first embodiment method except the step 7.

Therefore only step 7 will be explained in detail.

Step 7: Thermally oxidize a surface portion of the groove portion formed in the silicon substrate 1 in a $H_2/O_2$ mixed gas oxidation atmosphere (in a range of $0 \leq r \leq 0.5$ where "r" is the gas flow rate) to thereby oxidize the groove portion formed in the semiconductor substrate 1 within the range that buries a vacant space of the pad oxide film 2 due to removal thereof.

An explanation will next be given of an operation and effect of the third embodiment with reference to the drawings.

An operation and effect of the third embodiment is as follows. As has been discussed in conjunction with the first embodiment above after the space of the regressed pad oxide film 2 was filled, warp deformation can occur at the silicon nitride film 12. This results in generation of the compressive forces at the pad oxide film 2 and silicon substrate 1 which underlie the silicon nitride film 12. The compressive forces act to suppress or restrict progression of the intended oxidation resulting in the upper groove edges of silicon substrate 1 being acutely sharpened in cross-sectional shape.

As previously stated, the oxidation amount be within the range that fills the space of the regressed pad oxide film 2 prevent production of compressive forces otherwise occurring due to warp deformation, which in turn enables smooth progress of the oxidation at the upper groove edges of silicon substrate 1 resulting in achievement of rounding at those portions near or around the upper groove edges of silicon substrate 1. Further, it eliminate creation of level difference irregularity at the upper groove edges because of the fact that the removal amount of pad oxide film 2 is set falling within the limited range of from 5 to 40 nm, as in the first embodiment.

For the reason above, in accordance with the third embodiment of the invention, it sufficiently increase the radius curvature at or near the substrate-side upper groove edges in the groove separation structure so that its value goes beyond 3 nm. In addition, the capability to prevent creation of level difference surface irregularity eliminate increase of transistor leak current otherwise occurring due to local electric-field concentration near or around the gate electrode film ends or alternatively prevent reduction of the withstanding voltage properties thereof which advantageously leads to the improvability of electrical reliability of transistors.

What is claimed is:

1. In a method for manufacturing a semiconductor device which has a shallow groove isolation structure as electrical insulation:

(a) providing a semiconductor substrate;
   (b) forming a pad oxide film above a circuit formation surface of said semiconductor substrate;
   (c) forming an oxide inhibition film above said pad oxide film;
   (d) after said forming the oxide inhibition film step, removing parts of said oxide inhibition film, said pad oxide film and forming a groove in said semiconductor substrate;
   (e) after forming said groove removing said pad oxide film from an upper edge of said groove within a range of from 5 to 40 nm;
   (f) after said removing said pad oxide film step, oxidizing a region of said groove.

2. In a method for manufacturing a semiconductor device according to claim 1, wherein said oxidizing a region of said groove step is performed under an oxidation environment with a gas ratio of hydrogen to oxygen being less than or equal to 0.5.

3. In a method for manufacturing a semiconductor device according to claim 1, wherein said pad oxide film formed on said semiconductor device and said inhibition oxide film formed on said pad oxide film.

4. In a method for manufacturing a semiconductor device according to claim 1, wherein said semiconductor is made of silicon said pad oxide film is made of silicon oxide and said oxide inhibition film is made from silicon nitride.

5. A method for manufacturing a semiconductor device which has a shallow groove isolation structure as electrical insulation comprising the steps of:

(a) providing a semiconductor substrate with a pad oxide film and an oxide inhibition film laminated on a circuit formation surface of said semiconductor substrate, with parts of said oxide inhibition film and said pad oxide film removed, and with a groove formed in said circuit formation surface of said semiconductor substrate;
   (b) removing said pad oxide film from an upper edge of said groove within a range of from 5 to 40 nm;
   (c) after said removing said pad oxide film step, oxidizing a region of said groove.

6. In a method for manufacturing a semiconductor device according to claim 5, wherein said oxidizing a region of said groove step is performed under an oxidation environment with a gas ratio of hydrogen to oxygen being less than or equal to 0.5.

7. In a method for manufacturing a semiconductor device according to claim 5, wherein said pad oxide film is formed on said semiconductor device and said inhibition oxide film is formed on said pad oxide film.

8. In a method for manufacturing a semiconductor device according to claim 5, wherein said semiconductor is made of silicon, said pad oxide film is made of silicon oxide and said oxide inhibition film is made from silicon nitride.

* * * * *